US009735292B2

(12) United States Patent
Yvon

(10) Patent No.: US 9,735,292 B2
(45) Date of Patent: Aug. 15, 2017

(54) HIGH-VOLTAGE GALLIUM NITRIDE SCHOTTKY DIODE

(71) Applicant: STMicroelectronics (Tours) SAS, Tours (FR)

(72) Inventor: Arnaud Yvon, Saint-Cyr sur Loire (FR)

(73) Assignee: STMicroelectronics (Tours) SAS, Tours (FR)

( * ) Notice: Subject to any disclaimer, the term of this patent is extended or adjusted under 35 U.S.C. 154(b) by 0 days.

(21) Appl. No.: 15/055,791

(22) Filed: Feb. 29, 2016

(65) Prior Publication Data

US 2017/0062625 A1 Mar. 2, 2017

(30) Foreign Application Priority Data

Aug. 28, 2015 (FR) ...................... 15 58035

(51) Int. Cl.
| | |
|---|---|
| *H01L 29/15* | (2006.01) |
| *H01L 29/872* | (2006.01) |
| *H01L 29/417* | (2006.01) |
| *H01L 29/66* | (2006.01) |
| *H01L 29/20* | (2006.01) |
| *H01L 29/205* | (2006.01) |
| *H01L 23/48* | (2006.01) |
| *H01L 27/02* | (2006.01) |
| *H01L 27/08* | (2006.01) |

(52) U.S. Cl.
CPC .......... *H01L 29/872* (2013.01); *H01L 23/481* (2013.01); *H01L 27/0207* (2013.01); *H01L 27/0814* (2013.01); *H01L 29/2003* (2013.01); *H01L 29/205* (2013.01); *H01L 29/417* (2013.01); *H01L 29/66212* (2013.01)

(58) Field of Classification Search
CPC . H01L 2224/83007; H01L 2224/83203; H01L 2224/83851; H01L 24/83; H01L 27/124
USPC ............................................................ 257/76
See application file for complete search history.

(56) References Cited

U.S. PATENT DOCUMENTS

| | | | |
|---|---|---|---|
| 7,078,743 B2 * | 7/2006 | Murata | ............... H01L 29/7787 257/12 |
| 8,088,660 B1 | 1/2012 | Siemieniec et al. | |
| 8,791,508 B2 | 7/2014 | Roberts et al. | |
| 2006/0108659 A1 | 5/2006 | Yanagihara et al. | |
| 2012/0153300 A1 * | 6/2012 | Lidow | ................... H01L 21/743 257/77 |

(Continued)

FOREIGN PATENT DOCUMENTS

JP 2009272441 A 11/2009

OTHER PUBLICATIONS

INPI Search Report and Written Opinion for FR 1558035 dated Jun. 28, 2016 (12 pages).

*Primary Examiner* — Andy Huynh
(74) *Attorney, Agent, or Firm* — Gardere Wynne Sewell LLP

(57) ABSTRACT

A Schottky diode is formed on a silicon support. A non-doped GaN layer overlies the silicon support. An AlGaN layer overlies the non-doped GaN layer. A first metallization forming an ohmic contact and a second metallization forming a Schottky contact are provided in and on the AlGaN layer. First vias extend from the first metallization towards the silicon support. Second vias extend from the second metallization towards an upper surface.

23 Claims, 3 Drawing Sheets

(56) References Cited

U.S. PATENT DOCUMENTS

2014/0103398 A1    4/2014   Curatola et al.

* cited by examiner

HIGH-VOLTAGE GALLIUM NITRIDE SCHOTTKY DIODE

PRIORITY CLAIM

This application claims the priority benefit of French Application for Patent No. 1558035, filed on Aug. 28, 2015, the contents of which is hereby incorporated by reference in its entirety to the maximum extent allowable by law.

TECHNICAL FIELD

The present disclosure relates to electronic components, and more particularly to gallium nitride (GaN) Schottky diodes capable of operating at high voltage and high power.

BACKGROUND

U.S. Pat. No. 8,791,508 (incorporated by reference) describes electronic components such as diodes and transistors where the main current flows laterally through a thin gallium-aluminum nitride layer, AlGaN, formed on a GaN layer.

FIG. 1A is a cross-section view of a portion of a GaN Schottky diode which corresponds to FIG. 7 of U.S. Pat. No. 8,791,508. A non-doped silicon support 1 is covered with an aluminum nitride layer 3, with a non-doped GaN layer 5, and with a non-doped AlGaN layer 7. Palladium metallizations 9 are deposited on layer 7 and are surrounded with metallizations 11 of titanium-aluminum Ti—Al formed through layer 7. Metallizations 9 form Schottky contacts with the AlGaN and metallizations 11 are in ohmic contact by their sides with the AlGaN layer. Gold metallizations 15 are deposited on metallizations 9 and gold metallizations 17 are deposited on metallizations 11. The assembly is covered with an insulating layer 19.

AlGaN layer 7 bonded to GaN layer 5 is capable of conducting a current laterally between Schottky and ohmic metallizations 9 and 11. When the diode is forward biased, a current laterally flows from the sides of metallizations 11 towards the periphery of metallizations 9.

FIG. 1B is an example of a top view according to cross-section B-B of FIG. 1A. Metallizations 9 and 11 comprise an assembly of alternated parallel strips. Strips 9 form the teeth of a first comb, and strips 11 form the teeth of a second comb interleaved with the first one. Only three teeth are shown in FIG. 1A, a larger number of teeth being shown in FIG. 1B for a better understanding. Each of the combs is connected to a terminal, 20, 21, of the diode.

A problem is that if the teeth of the combs are long and narrow, a non-negligible resistance appears in the conductive state.

SUMMARY

Thus, an embodiment provides a Schottky diode comprising, between a lower surface and an upper surface: a silicon support; a non-doped GaN layer; one or a plurality of patterns formed in an AlGaN layer, each of which extends between a first metallization forming an ohmic contact and a second metallization forming a Schottky contact; first vias extending from the second metallizations towards the upper surface; and second vias extending from the first metallizations towards the lower surface.

According to an embodiment, the patterns are periodically repeated.

According to an embodiment, the silicon support is made of doped silicon.

According to an embodiment, the Schottky diode further comprises, between the silicon support and the GaN layer, a non-doped silicon layer.

According to an embodiment, the Schottky diode further comprises, between the silicon support and non-doped silicon layer, a silicon oxide layer.

According to an embodiment, the second vias extend all the way to the silicon support.

According to an embodiment, the Schottky diode comprises, in the non-doped silicon layer, doped silicon areas in contact with the second vias.

According to an embodiment, the second metallization comprises first periodically-repeated islands.

According to an embodiment, the first metallization forms a honeycomb network.

According to an embodiment, the first metallization comprises second periodically-repeated islands.

According to an embodiment, the first islands and the second islands form a checkerboard pattern.

BRIEF DESCRIPTION OF THE DRAWINGS

The foregoing and other features and advantages will be discussed in detail in the following non-limiting description of specific embodiments in connection with the accompanying drawings.

DETAILED DESCRIPTION

Figure 1A:
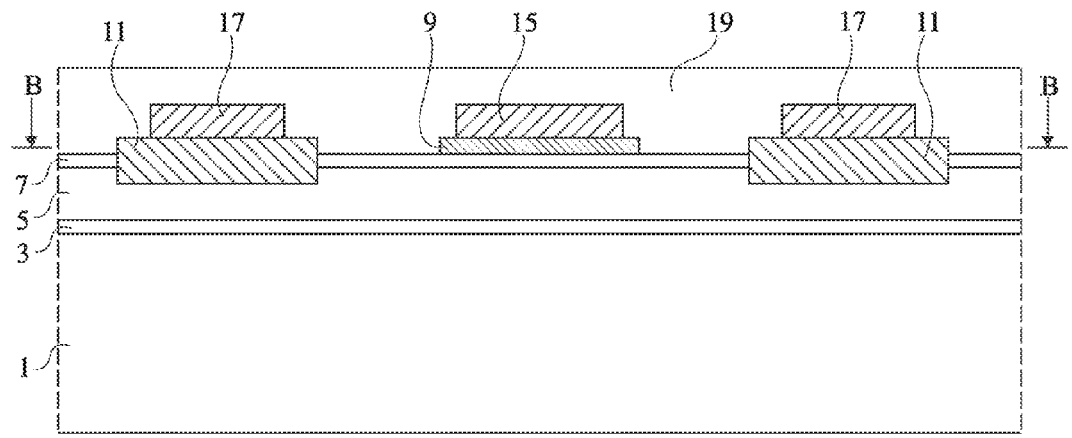
FIG. 1A, previously described, is a partial cross-section view of a GaN Schottky diode.

The same elements have been designated with the same reference numerals in the different drawings and, further, the various drawings are not to scale. For clarity, only those elements which are useful to the understanding of the described embodiments have been shown and are detailed.

In the following description, when reference is made to terms qualifying absolute positions, such as terms "high", "low", etc., or relative positions, such as terms "above", "upper", "lower", etc., or to terms qualifying orientation, such as term "horizontal", "vertical", reference is made to the orientation of the cross-section views.

Figure 2:
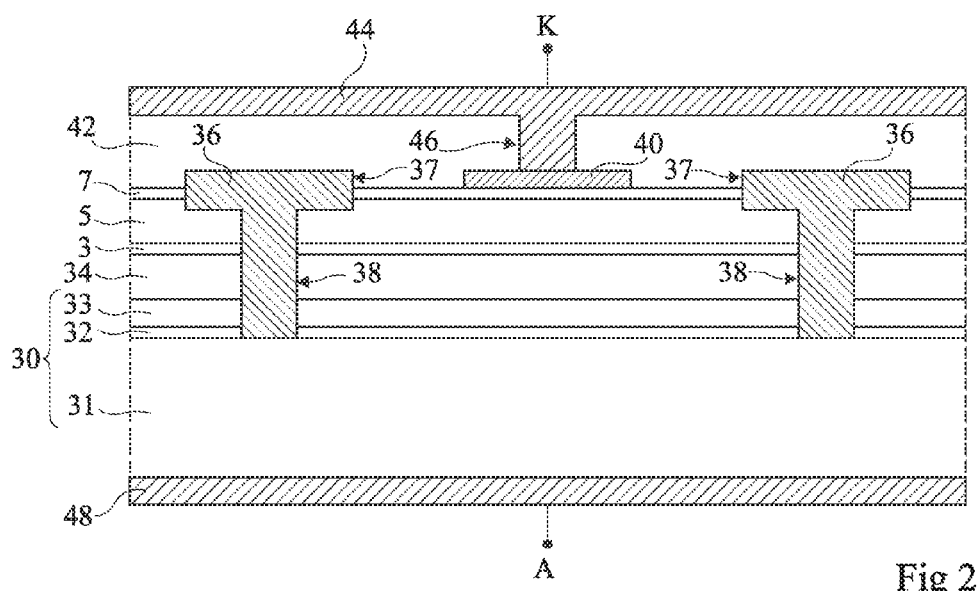
FIG. 2 is a partial simplified cross-section view of an embodiment of a GaN Schottky diode.

FIG. 2 is a partial simplified cross-section view of an embodiment of a GaN Schottky diode.

To form the structure of FIG. 2, it may be started from a wafer 30 of silicon-on-insulator type (SOI), formed of a P-type doped silicon support 31, covered with a silicon oxide layer 32, having a silicon layer 33 located thereon. On layer 33, a non-doped silicon layer 34 having its function explained hereafter is preferably grown by epitaxy. After this, a layer 3 of aluminum nitride, AlN, is deposited by epitaxy on non-doped silicon layer 34. Layer 3 is used as an interface layer for the epitaxy of a layer 5 of non-doped GaN, having a non-doped AlGaN layer 7 deposited by epitaxy thereon.

Conductive layers 36, only two of which are shown, are then formed. Each conductive area comprises an upper portion or metallization 37 having its level reaching or higher than the surface of AlGaN layer 7 and which extends through layer 7 in a portion of GaN layer 5. Thereby, each of metallizations 37 is in ohmic contact with layer 7 by its sides. Each conductive area 36 also comprises a vertical portion or via 38 which extends from a central portion of the upper portion through layers 5, 3, 34, 33, and 32 and joins support 31. Conductive areas 36 are for example made of Ti—Al.

Metallizations 40, only one of which is shown, forming a Schottky contact with AlGaN layer 7, are then deposited on layer 7 between metallizations 37. The surface of the assembly is then coated with an insulating layer 42, for example, silicon oxide or silicon nitride. Openings are etched through insulating layer 42 all the way to metallizations 40. A metallization 44, filling these openings and covering the surface of the device, is formed. The openings filled with metal form vias 46 connecting Schottky metallizations 40 to metallization 44. Metallizations 40 are for example made of platinum or palladium or nickel or nickel-gold.

A metallization 48 in contact with doped silicon support 31 is formed on the lower surface of wafer 30. Metallizations 44 and 48 may be made of copper or of aluminum and may cover all the lower and upper surfaces of the diode, to decrease the access resistance of the cathode and of the anode. Metallizations 44 and 48 are respectively connected to cathode and anode terminals K and A.

In the conductive state, a current originating from terminal A flows from doped silicon support 31 and vias 38 towards metallizations 37. The current then flows horizontally, or laterally, in AlGaN layer 7 bonded to GaN layer 5, all the way to Schottky metallizations 40, and then propagates in vias 46 to reach terminal K.

In the off state, the voltage applied between terminals K and A may reach several hundreds of volts. The insulating layers present between conductive support 31 connected to terminal A and metallization 40 connected to terminal K are submitted to this voltage. Non-doped silicon insulating layer 34 adds an additional thickness to layers 3, 5, and 7, thus improving, if necessary, the breakdown voltage.

Figure 1B:
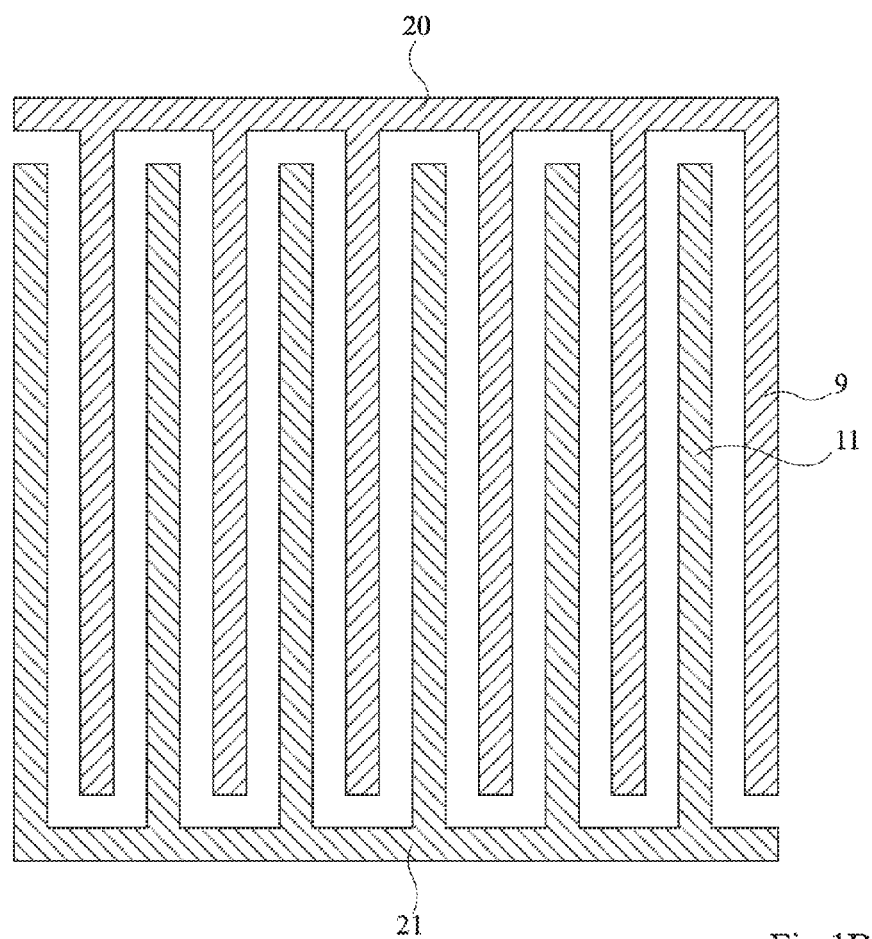
FIG. 1B, previously described, is a top view of a GaN Schottky diode.

In top view, Schottky and ohmic metallizations 40 and 37 may correspond to parallel alternated teeth, similarly to what has been described in relation with FIG. 1B. Each Schottky tooth 40 is then connected to metallization 44 by a plurality of regularly arranged vias 46. Each ohmic tooth is similarly connected to support 31 by a plurality of vias.

Vias 38 apply the potential of terminal A to a plurality of points of each ohmic tooth 37. Similarly, vias 46 apply the potential of terminal K to a plurality of points of each Schottky tooth. It should be clear that the presence of multiple vias 38 and 46 enables to limit the resistance of access to the diode.

Figure 3:
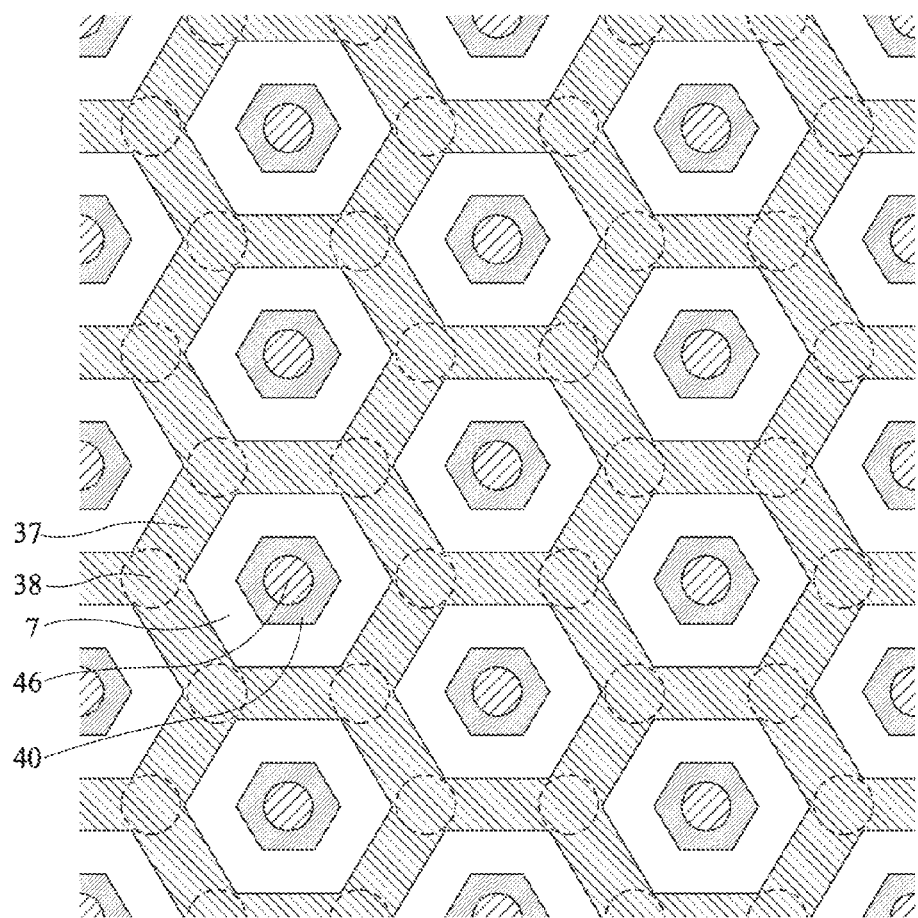
FIG. 3 is a top view of an example of a GaN Schottky diode topology.

FIG. 3 is a top view of another example of topology of a GaN Schottky diode corresponding to the cross-section view of FIG. 2. This top view is drawn in the absence of insulating layer 42 and of upper metallization 44. Although only three metallizations have been shown in FIG. 2, a greater number of metallizations is shown in FIG. 3 to ease the understanding.

Ohmic metallizations 37 form a continuous network of regular hexagons in a honeycomb layout. In the shown example, cylindrical vias 38, shown, in dotted lines, are located at the network nodes. A hexagonal Schottky metallization island 40 of same orientation as that of the network hexagons is located at the center of each of the hexagons. Each island 40 is in contact in its central portion with a via 46. Thus, a ring of layer 7 is present between each Schottky island 40 and the surrounding ohmic metallization 37.

According to numerical simulations performed by the inventor, this configuration minimizes the diode surface area. Further, such a configuration enables to limit the surface and the cost of Schottky metallizations.

Figure 4:
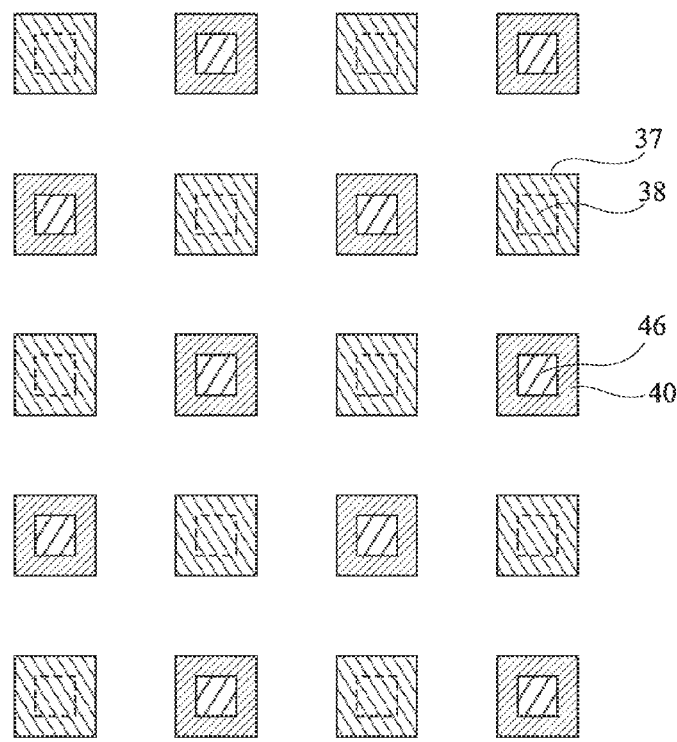
FIG. 4 is a top view of another example of a GaN Schottky diode topology.

FIG. 4 is a top view of another example of GaN Schottky diode topology corresponding to the cross-section view of FIG. 2.

Schottky metallizations 37 and ohmic metallizations 40 are islands of square shape and of same dimensions which form two assemblies arranged in a checkerboard pattern. Each of islands 36 and 40 occupies a central portion of each box, not shown, of the checkerboard. Vias 38 are located at the center of islands 37 and vias 46 are in contact with the central portion of islands 40. Such a topology appears to be more efficient than the parallel strip topology.

Figure 5:
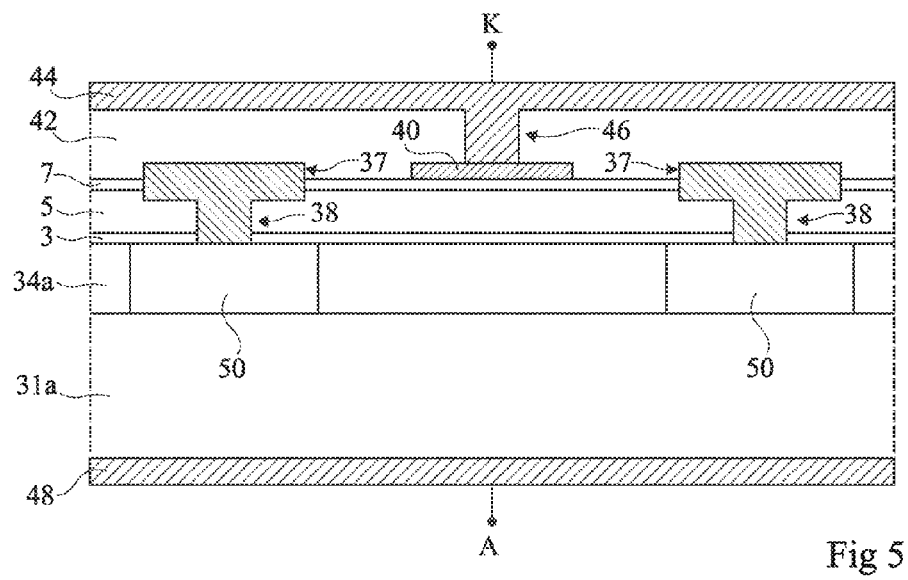
FIG. 5 is a partial simplified cross-section view of another embodiment of a GaN Schottky diode.

FIG. 5 is a partial simplified cross-section view of another embodiment of a GaN Schottky diode. To form the structure of FIG. 5, it is started from a solid doped silicon substrate, and not from a SOI wafer.

On a P-type doped silicon substrate 31a, a non-doped silicon layer 34a is formed by epitaxy. At a next step, P-type doped areas 50 are formed across the entire thickness of layer 34a opposite ohmic metallizations 37.

The diode comprises, from bottom to top, a metallization 48, substrate 31a, layer 34a with the two areas 50, an AlN layer 3, a GaN layer 5, an AlGaN layer 7, an insulating layer 42, and a metallization 44. Metallizations 37 are located above areas 50, through layer 7, between a level located in layer 5 and a level located in layer 42. Metallizations 37 are connected to areas 50 by vias 38 running through layers 3 and 5. Schottky metallizations 40 in contact with layer 7 are located at the level of a lower portion of layer 42. Metallization 44 is in contact by vias 46 with Schottky metallizations 40.

Metallizations 37 are thus connected to substrate 31a via vias 38 and conductive areas 50.

Metallizations 44 and 48 may be made of copper or of aluminum and may cover all the lower and upper surfaces of the Schottky diode, to decrease the access resistance of the cathode and of the anode.

As a variation, doped areas 50 may be omitted in the structure of FIG. 5. To ensure the contact of metallizations 37 with substrate 31a, vias 38 then extend through non-doped silicon layer 34a.

An advantage of Schottky diodes according to the above-described embodiments is that the resistance is low in the conductive state.

Another advantage is that the component surface area is decreased, since no additional space is required to form contact pads.

Another advantage is that the provision of a non-doped silicon layer 34, 34a on a doped silicon support 31, 31a provides a less fragile (less brittle) structure than when the support is entirely non-doped silicon. Thereby, GaN layer 5 may be thicker without for thermal processes linked to its epitaxy to risk breaking the support.

Specific embodiments have been described. Various alterations, modifications, and improvements will occur to those skilled in the art. In particular, although specific periodic patterns repeated according to hexagonal and square networks have been described in relation with FIGS. 3 and 4, it should be clear that other patterns, preferably periodic, may be provided.

Although the described structures are formed from P-type doped silicon supports, identical structures may be formed from N-type doped supports.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A Schottky diode comprising, in the following order between a lower surface and an upper surface:
   a doped silicon support;
   a non-doped silicon layer;
   a buffer layer;
   a non-doped GaN layer; and
   an AlGaN layer; and
   further including:
      a first metallization extending through the AlGaN layer forming an ohmic contact;
      a second metallization on the AlGaN layer forming a Schottky contact;
      a first via extending from the first metallization towards the lower surface and passing through the non-doped GaN layer, the buffer layer and the non-doped silicon layer; and
      a second via extending from the second metallization towards the upper surface.

2. The Schottky diode of claim 1, wherein the first and second metallizations each form a periodically repeated pattern.

3. The Schottky diode of claim 1, further comprising, between the doped silicon support and the non-doped silicon layer, a silicon oxide layer, and wherein said first via further extends passing through the silicon oxide layer.

4. The Schottky diode of claim 1, wherein the first via extends to make contact with a top of the doped silicon support.

5. The Schottky diode of claim 1, wherein the second metallization comprises periodically repeated first islands.

6. The Schottky diode of claim 5, wherein the first metallization forms a honeycomb network including a plurality of openings, and said first islands are positioned within said plurality of openings.

7. The Schottky diode of claim 5, wherein the first metallization comprises periodically repeated second islands.

8. The Schottky diode of claim 7, wherein the first islands and the second islands form a checkerboard pattern.

9. The Schottky diode of claim 1, wherein the buffer layer is on and in direct contact with the non-doped silicon layer, and wherein the non-doped GaN layer is on and in direct contact with the buffer layer.

10. A Schottky diode, comprising:
    a silicon on insulator substrate having a semiconductor support, an insulator layer on the semiconductor support and a semiconductor layer on the insulator layer;
    an AlGaN layer over the silicon on insulator substrate;
    a non-doped silicon layer between the semiconductor layer and the AlGaN layer;
    a non-doped GaN layer between the non-doped silicon layer and the AlGaN layer;
    a first metallization pattern extending through the AlGaN layer forming an ohmic contact;
    a second metallization pattern on the AlGaN layer forming a Schottky contact;
    first vias extending from a bottom of the first metallization pattern through the non-doped GaN layer, the non-doped silicon layer, the semiconductor layer and the insulator layer to contact the semiconductor support; and
    second vias extending from a top of the second metallization pattern through a further insulating layer overlying the first and second metallization patterns.

11. The Schottky diode of claim 10, further comprising an aluminum nitride layer between the non-doped silicon layer and the non-doped GaN layer, said first vias further passing through said aluminum nitride layer.

12. The Schottky diode of claim 11, wherein the aluminum nitride layer is on and in direct contact with the non-doped silicon layer and the non-doped GaN layer is on and in direct contact with the aluminum nitride layer.

13. The Schottky diode of claim 10, wherein the first and second metallization patterns form interleaved strips.

14. The Schottky diode of claim 10, wherein the first metallization pattern forms hexagons and the second metallization pattern forms islands within the hexagons.

15. The Schottky diode of claim 10, wherein the first and second metallization patterns form islands arranged in a checkerboard pattern.

16. A Schottky diode, comprising:
    a bulk semiconductor substrate;
    a non-doped semiconductor layer on the bulk semiconductor substrate;
    a plurality of doped regions within the non-doped semiconductor layer;
    an AlGaN layer over the non-doped semiconductor layer;
    a first metallization pattern extending through the AlGaN layer forming an ohmic contact;
    a second metallization pattern on the AlGaN layer forming a Schottky contact;
    first vias extending from a bottom of the first metallization pattern to contact the doped regions of the non-doped semiconductor layer; and
    second vias extending from a top of the second metallization pattern through an insulating layer overlying the first and second metallization patterns.

17. The Schottky diode of claim 16, further comprising an aluminum nitride layer between the non-doped semiconductor layer and the AlGaN layer, said first vias further passing through said aluminum nitride layer.

18. The Schottky diode of claim 16, further comprising a non-doped GaN layer between the non-doped semiconductor layer and the AlGaN layer, said first vias further passing through said non-doped GaN layer.

19. The Schottky diode of claim 16, wherein the first and second metallization patterns form interleaved strips.

20. The Schottky diode of claim 16, wherein the first metallization pattern forms hexagons and the second metallization pattern forms islands within the hexagons.

21. The Schottky diode of claim 16, wherein the first and second metallization patterns form islands arranged in a checkerboard pattern.

22. The Schottky diode of claim 16, wherein plurality of doped regions have a same thickness as the non-doped semiconductor layer and contact a top of the bulk semiconductor substrate.

23. The Schottky diode of claim 16, further including a buffer layer on and in direct contact with the non-doped semiconductor layer.

* * * * *